United States Patent
Hung et al.

(10) Patent No.: US 10,211,198 B2
(45) Date of Patent: Feb. 19, 2019

(54) HIGH VOLTAGE ELECTROSTATIC DISCHARGE (ESD) PROTECTION

(71) Applicant: Macronix International Co., Ltd., Hsinchu (TW)

(72) Inventors: Tzu-Yi Hung, Hsinchu (TW); Hsin-Liang Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 15/587,485

(22) Filed: May 5, 2017

(65) Prior Publication Data
US 2018/0323184 A1 Nov. 8, 2018

(51) Int. Cl.
| H01L 27/02 | (2006.01) |
| H01L 21/265 | (2006.01) |
| H01L 21/8249 | (2006.01) |
| H01L 29/36 | (2006.01) |

(52) U.S. Cl.
CPC ........ H01L 27/0262 (2013.01); H01L 21/265 (2013.01); H01L 21/8249 (2013.01); H01L 29/36 (2013.01)

(58) Field of Classification Search
CPC ............................ H01L 27/0262; H01L 29/36
USPC ........................................................ 257/140
See application file for complete search history.

(56) References Cited

U.S. PATENT DOCUMENTS

| 5,343,053 | A | * | 8/1994 | Avery | ................. H01L 27/0259 257/173 |
| 8,519,434 | B2 | | 8/2013 | Chen et al. | |
| 9,349,716 | B2 | * | 5/2016 | Sorgeloos | ................. H01L 29/87 |
| 2006/0125015 | A1 | * | 6/2006 | Woo | .................... H01L 27/0248 257/355 |
| 2010/0078717 | A1 | | 4/2010 | Venkatraman | |
| 2010/0320501 | A1 | * | 12/2010 | Gendron | ............. H01L 27/0259 257/173 |
| 2012/0281329 | A1 | | 11/2012 | Mallikarjunaswamy | |
| 2014/0353799 | A1 | | 12/2014 | Hwang | |
| 2015/0084154 | A1 | * | 3/2015 | Hsu | ........................ H01L 29/735 257/491 |
| 2015/0364471 | A1 | | 12/2015 | Chang et al. | |
| 2016/0111411 | A1 | | 4/2016 | Kalnitsky et al. | |
| 2016/0204598 | A1 | | 7/2016 | Wang et al. | |
| 2016/0276335 | A1 | | 9/2016 | Laine et al. | |

FOREIGN PATENT DOCUMENTS

TW 201635475 10/2016

* cited by examiner

*Primary Examiner* — Jami Valentine Miller
(74) *Attorney, Agent, or Firm* — Fish & Richardson P.C.

(57) ABSTRACT

Methods, circuits, devices, and systems for high voltage electrostatic discharge (ESD) protection are provided. An example ESD protection device includes: a base well of a first dopant type on a substrate, a first well of the first dopant type in the base well, a second well of a second dopant type in the base well, a first highly doped region of the first dopant type and a second highly doped region of the second dopant type in the first well, a third highly doped region of the second dopant type in the second well, and a fourth highly doped region of the first dopant type in the third highly doped region. The first highly doped region and the second highly doped region are coupled to a first voltage terminal, and the third highly doped region and the fourth highly doped region are coupled to a second voltage terminal.

19 Claims, 8 Drawing Sheets

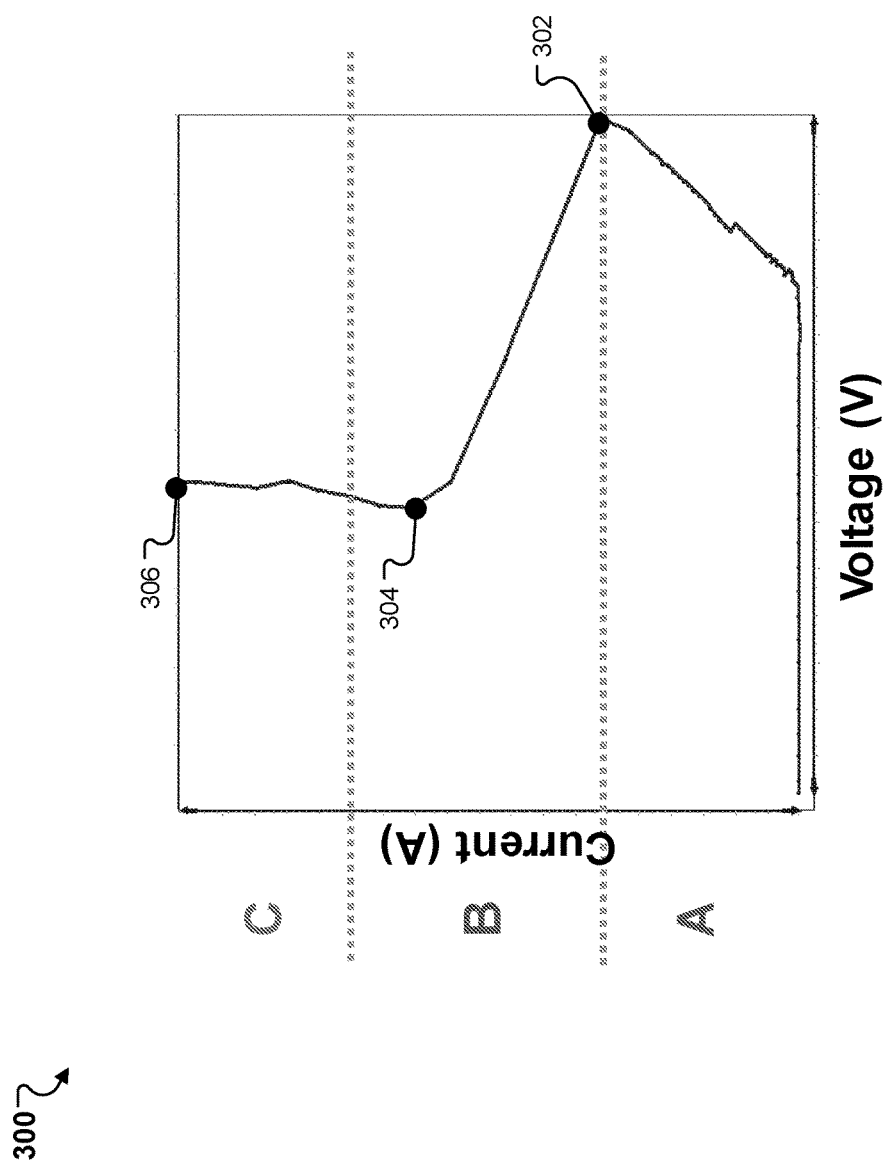

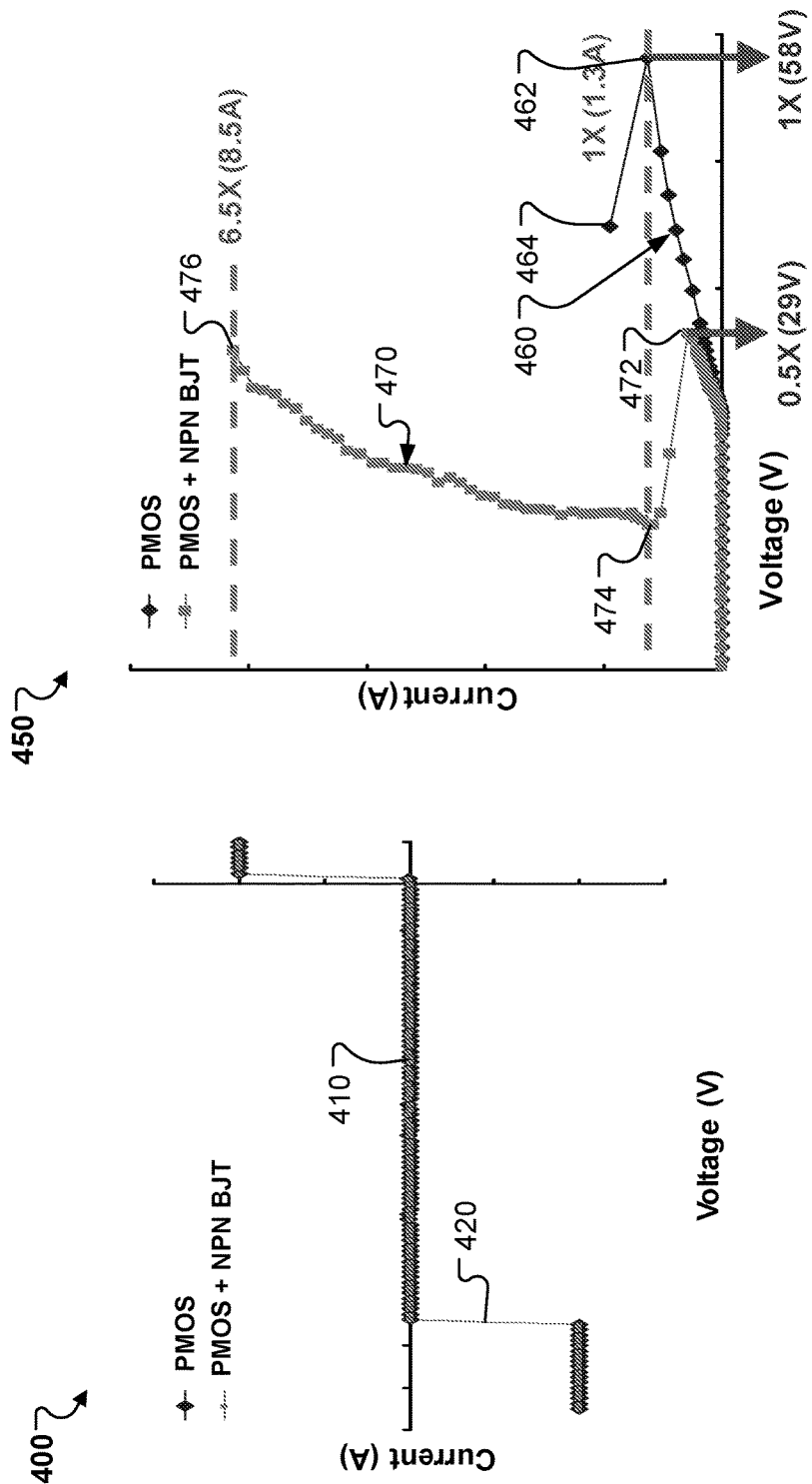

HIGH VOLTAGE ELECTROSTATIC DISCHARGE (ESD) PROTECTION

BACKGROUND

Electrostatic Discharge (ESD) is a rapid discharge that flows between two objects due to a built-up of static charge. The rapid discharge in an ESD event can produce a relatively large current, which may damage or destroy semiconductor devices. To reduce the failures due to an ESD event, an ESD protection circuit can be utilized to provide a current discharge path. When an ESD event occurs, the discharge current is conducted through the current discharge path without going through an internal circuit or a device to be protected.

SUMMARY

The present disclosure describes circuits and devices for providing high voltage electrostatic discharge (ESD) protection and methods of fabricating such circuits and devices.

One aspect of the present disclosure features an electrostatic discharge (ESD) protection device including: a base well of a first dopant type disposed on a substrate; a first well of the first dopant type disposed in the base well; a second well of a second dopant type disposed in the base well; a first highly doped region of the first dopant type and a second highly doped region of the second dopant type disposed in the first well; a third highly doped region of the second dopant type disposed in the second well; and a fourth highly doped region of the first dopant type disposed in the third highly doped region. The first highly doped region and the second highly doped region are coupled to a first voltage terminal, and the third highly doped region and the fourth highly doped region are coupled to a second, different voltage terminal.

The first highly doped region, the second highly doped region, and the third highly doped region can constitute a first transistor, and the first highly doped region, the third highly doped region, and the fourth highly doped region can constitute a second transistor, and the first transistor and the second transistor are operably parallel between the first voltage terminal and the second voltage terminal.

In some implementations, the ESD protection device includes a plurality of fourth highly doped regions of the first dopant type disposed and distributed in the third highly doped region, and each of the fourth highly doped regions is separated from each other by a respective portion of the third highly doped region. Each of the respective portions of the third highly doped region can constitute a respective first transistor with the first highly doped region and the second highly doped region, each of the fourth highly doped regions can constitute a respective second transistor with the first highly doped region and the third highly doped region, and each of the first transistors and the second transistors can be operably parallel between the first voltage terminal and the second voltage terminal.

In some cases, along a direction perpendicular to an edge of an area defined by the third highly doped region, the first dopant type occupies a region having a first length, and the second dopant type occupies a region having a second length, and a ratio of the first length over the second length can be larger than 1. In a particular case, a number of the plurality of fourth doped region of the first dopant type is 5, and the ratio is about 1.6~1.9.

In some implementations, the ESD protection device includes a lowly doped region of the first dopant type disposed in the first well, the first highly doped region and the second highly doped region being in the lowly doped region, and the lowly doped region has a lower concentration of the first dopant type than the first well, and the first highly doped region has a higher concentration of the first dopant type than the first well.

The ESD protection device can further include a conductive layer coupled to the first voltage terminal, and the first highly doped region, the second highly doped region, the third highly doped region, and the conductive layer can constitute a metal-oxide-semiconductor (MOS) transistor with the conductive layer as a gate. The first dopant type can be N-type, and the second dopant type can be P-type. The substrate can include a substrate of the second dopant type or an epitaxial layer of the second dopant type.

In some implementations, the ESD protection device further includes: a third well of the first dopant type disposed in the base well adjacent to the second well and a fifth highly doped region of the first dopant type and a sixth highly doped region of the second dopant type disposed in the third well. The fifth highly doped region, the sixth highly doped region, and the third highly doped region can constitute a third transistor, and the fifth highly doped region, the third highly doped region, and the fourth highly doped region can constitute a fourth transistor, and the fifth highly doped region and the sixth highly doped region can be coupled to the first voltage terminal, the third transistor and the fourth transistor being operably parallel between the first voltage terminal and the second voltage terminal.

The ESD protection device can further include a field oxide layer configured to isolate the third highly doped region from second highly doped region. The ESD protection device can further include a conductive layer disposed on top of a portion of the field oxide layer that is between the second highly doped region and the third highly doped region. The first highly doped region can be arranged further to the second well than the second highly doped region that is arranged with a distance from the second well.

Another aspect of the present disclosure features an electrostatic discharge (ESD) protection circuit including: a first transistor of a first dopant type having a first emitter and a first base both electrically coupled to a first voltage terminal and a first connector electrically coupled to a second voltage terminal; a second transistor of a second dopant type having a second emitter and a second base both electrically coupled to the first collector and a second collector electrically coupled to the first base; and a third transistor of the first dopant type having a third emitter and a third base tied to the first emitter and the first base, respectively, and a third connector electrically coupled to the second voltage terminal, wherein the second emitter is arranged between the first connector and the third connector and adjacent to both the first connector and the third connector. The first transistor is operable to be turned on by a trigger voltage applied between the first voltage terminal and the second voltage terminal to generate a first trigger current, the third transistor is operable to be turned on by the trigger voltage to generate a second trigger current, and the second transistor is operable to be turned on by the first trigger current and the second trigger current and conduct an electrostatic discharge current between the first voltage terminal and the second voltage terminal.

The ESD protection circuit can further include a conductive layer coupled to the first voltage terminal, and a metal-oxide-semiconductor (MOS) transistor can be formed with the first emitter as a source, the first based as a body, the conductive layer as a gate, and the first conductor as a drain. The first dopant type can be N-type, and the second dopant type can be P-type, and the first transistor can include one of a PNP bipolar junction transistor (BJT) and a PMOS transistor, the second transistor can include an NPN BJT, and the third transistor can include one of a PNP BJT and a PMOS transistor.

The ESD protection circuit can include a plurality of N-type transistors and a plurality of P-type transistors, the N-type transistors including NPN BJTs, the P-type transistors including PNP BJTs or PMOS transistors, and each N-type transistor can be separated from each other with a respective P-type transistor and arranged between two adjacent P-type transistors, and each of the N-type transistors and the P-type transistors can be operably parallel to each other between the first voltage terminal and the second voltage terminal.

In some implementations, the ESD protection circuit includes: the first base is electrically coupled to a first highly doped region of the first dopant type in a first well of the first dopant type, the first emitter is electrically coupled to a second highly doped region of the second dopant type in the first well, the first conductor is electrically coupled to a third highly doped region of the second dopant type in a second well of the second dopant type, the second base is electrically coupled to the third highly doped region, the second emitter is electrically coupled to a fourth highly doped region of the first dopant type in the third highly doped region, the second conductor is electrically coupled to the first base, the third base is electrically coupled to the first highly doped region, the third emitter is electrically coupled to the second highly doped region, and the third conductor is electrically coupled to the third highly doped region.

In some examples, the ESD protection circuit includes a plurality of fourth highly doped regions of the first dopant type including the fourth highly doped region is disposed in the third highly doped region, and each of the fourth highly doped regions is separated from each other by a respective portion of the third highly doped region, each of the respective portions of the third highly doped region constitutes a respective first transistor with the first highly doped region and the second highly doped region, each of the fourth highly doped regions constitutes a respective second transistor with the first highly doped region and the highly third doped region, and each of the first transistors and the second transistors are operably parallel between the first voltage terminal and the second voltage terminal.

The ESD protection circuit can further include a fifth region of the first dopant type disposed in the first well, the first doped region and the second doped region being in the fifth region, and the fifth region has a lower concentration of the first dopant type than the first well, and the first region has a higher concentration of the first dopant type than the first well.

A third aspect of the present disclosure features a method of fabricating an electrostatic discharge (ESD) protection device on a substrate, including: forming a base well of a first dopant type on the substrate; forming a first well of the first dopant type and a second well of a second dopant type in the base well; forming a first highly doped region of the first dopant type and a second highly doped region of the second dopant type in the first well; forming a third highly doped region of the second dopant type in the second well; forming a fourth highly doped region of the first dopant type in the third highly doped region; and forming electric contacts for electrically coupling the first highly doped region and the second highly doped region to a first voltage terminal and the third highly doped region and the fourth highly doped region to a second voltage terminal. The first highly doped region, the second highly doped region, and the third highly doped region constitute a first transistor, and the first highly doped region, the third highly doped region, and the fourth highly doped region constitute a second transistor, and the first transistor and the second transistor are operably parallel between the first voltage terminal and the second voltage terminal.

In some implementations, the method includes forming a plurality of fourth highly doped regions of the first dopant type including the fourth highly doped region in the third highly doped region, each of the fourth highly doped regions is separated from each other by a respective portion of the third highly doped region, each of the respective portions of the third highly doped region constitutes a respective first transistor with the first highly doped region and the second highly doped region, each of the fourth highly doped regions constitutes a respective second transistor with the first highly doped region and the highly third doped region, and each of the first transistors and the second transistors are operably parallel between the first voltage terminal and the second voltage terminal.

The method can further include forming a lowly doped region of the first dopant type in the first well, the first highly doped region and the second highly doped region being formed in the lowly doped region, and the lowly doped region has a lower concentration of the first dopant type than the first well, and the first highly doped region has a higher concentration of the first dopant type than the first well. The method can further include forming a conductive layer coupled to the first voltage terminal, and the first highly doped region, the second highly doped region, the third highly doped region, and the conductive layer can constitute a metal-oxide-semiconductor (MOS) transistor with the conductive layer as a gate.

The first dopant type can be N-type, and the second dopant type can be P-type, and the first transistor can include one of a PNP bipolar junction transistor (BJT) and a PMOS transistor, and the second transistor can include an NPN BJT.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 3 is a schematic diagram of an example transmission-line pulse (TLP) curve of an ESD protection device, according to one or more implementations.

FIG. 4A show example breakdown voltage testing curves of ESD protection devices, according to one or more implementations.

FIG. 4B show example TLP testing curves of the ESD protection devices of FIG. 4A.

DETAILED DESCRIPTION

Figure 1A:
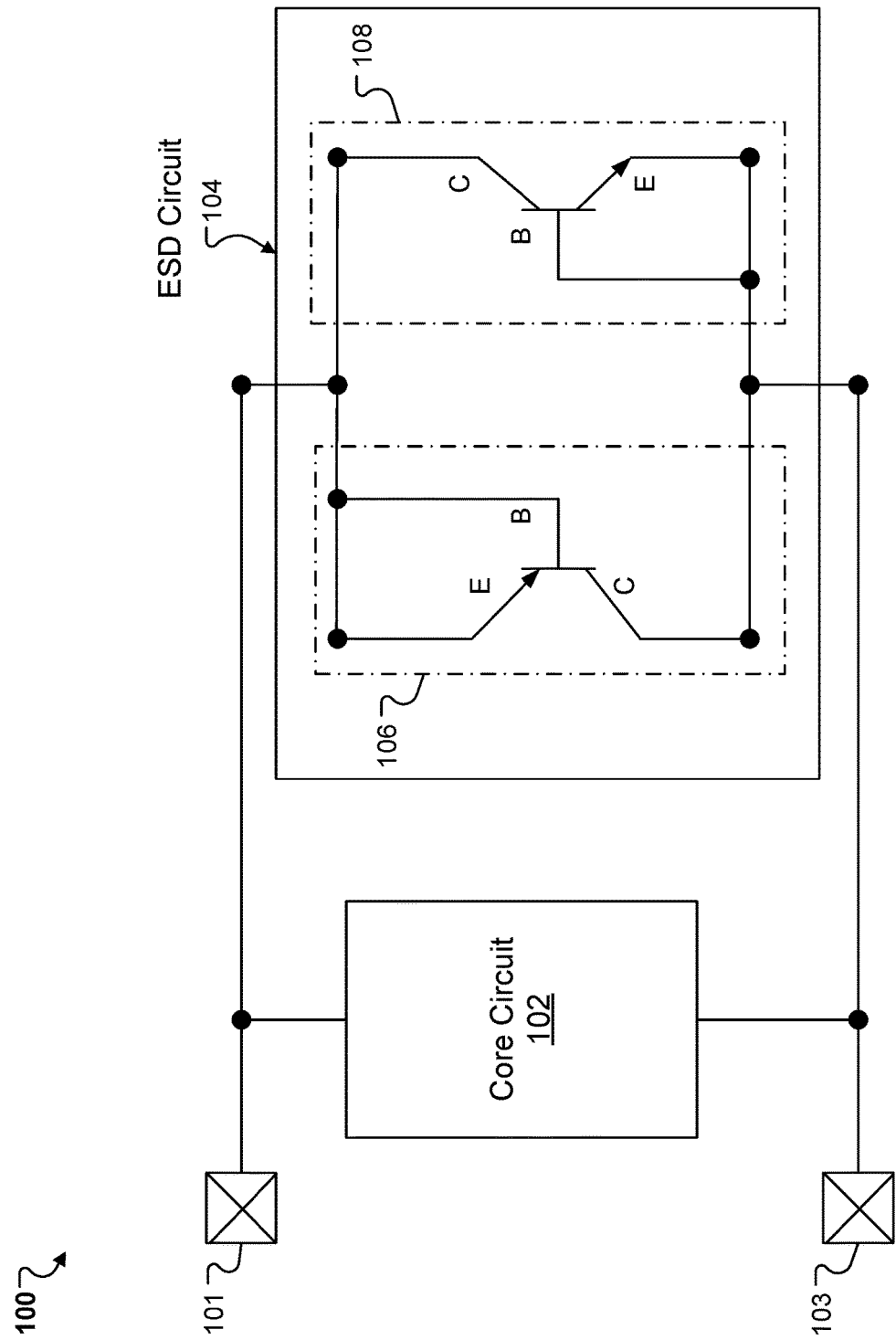
FIG. 1A is a schematic diagram of an example system having electrostatic discharge (ESD) protection, according to one or more implementations.

Low-voltage devices, e.g., complementary metal-oxide-semiconductor (CMOS) technology, may not always be practical for various functions. Thus, high voltage devices have been developed to handle applications where low-voltage devices are not suitable.

A high-voltage (HV) device may require a low on-state resistance, a high breakdown voltage, and a low holding voltage. The low on-state resistance tends to make an ESD current more likely to concentrate on the surface or the drain edge of the HV device during an ESD event. This high current and high electric field can cause physical damage at a surface junction region of the HV device. Because of the electrical requirement that such device maintain a low on-state resistance, the surface or lateral rules associate with the device cannot be increased, which would otherwise lead to an increase in the high-voltage device on-state resistance. Thus, improving an ESD protection structure can be a challenge in an HV device.

In addition, the high breakdown voltage characteristic of the HV device means that the breakdown voltage is higher than an operation voltage, and the trigger voltage is higher than the high breakdown voltage. Accordingly, during an ESD event, a protected HV device can be at risk to be damaged before the HV device is turned on for ESD protection. An approach to reduce the trigger voltage is to use an additional external ESD detection circuit. The low holding voltage characteristic of the HV device leaves open the possibility that the HV device will be triggered by unwanted noise, e.g., a power-on peak voltage or serge voltage and that a latch-up may occur during normal operation. The HV device can also experience a field plate effect due to the fact that an electric field distribution can be sensitive to routing so that the ESD current is likely to concentrate at the surface or the drain edge during an ESD event.

In some cases, the ESD performance of the HV device can be improved by increasing additional masks or processes. In some cases, additional devices for ESD protection can be added. The additional ESD devices can include a large size diode with bipolar junction transistor (BJT) components, a metal oxide semiconductor (MOS) transistor with increased surface or lateral rules, or a Silicon Controlled Rectifier (SCR). However, additional masks and processes increase manufacturing time and cost.

The present disclosure relates to a high voltage ESD protection circuit that uses an N-type transistor in parallel with a P-type transistor. The P-type transistor is a trigger source configured to trigger on the N-type transistor to conduct an ESD current during an ESD event. The P-type transistor can be a PNP BJT or a P-type metal oxide semiconductor transistor (PMOS). The N-type transistor can be an NPN BJT or an N-type metal oxide semiconductor transistor (NMOS).

In some implementations, a high voltage ESD protection device includes a PMOS transistor and an NPN BJT that are operably parallel between a higher voltage terminal and a lower voltage terminal. An emitter of the NPN BJT is coupled to a drain side of the high voltage PMOS with N+ implantation; a collector of the NPN BJT is coupled to the high voltage PMOS's body side with N+ implantation; and a base of the NPN BJT is coupled to the high voltage PMOS's drain side with P+ implantation. The source and body sides of the high voltage PMOS are coupled to P+ implanted and N+ implanted regions, respectively.

Compared to a typical MOS transistor for ESD protection, the ESD protection device as described herein can have a breakdown voltage same as the breakdown voltage of the MOS transistor, a trigger voltage smaller than (e.g., a half of) the trigger voltage of the MOS transistor, and a trigger current higher than (e.g., more than 5 times) the trigger current of the MOS transistor. The higher trigger current enhances the ESD performance. For example, the higher trigger current can increase the ease of avoiding a latch-up event.

The ESD protection device can be fabricated by standard processes without additional masks or processes, for example, triple well process, BCD (Bipolar-complementary metal-oxide-semiconductor (CMOS)—double-diffused metal-oxide-semiconductor (DMOS)) process, non-epitaxially-grown layer (non-EPI) process with triple well process or twin well process, and/or single poly or double poly process. No additional devices for ESD protection are needed, which enables the ESD device to have a total area that is the same as a high voltage MOS transistor.

This technology of high voltage ESD protection can be applied to any suitable process and any suitable operation voltage. Besides high voltage devices, the technologies can be also used for ESD self-protection, DC (direct current) application, and/or low voltage applications.

FIG. 1A is a schematic diagram of an example system 100 having electrostatic discharge (ESD) protection. The system 100 includes a core circuit 102 and an ESD protection circuit 104 coupled between terminals 101 and 103. The core circuit 102 can be any suitable circuit or device to be protected. Terminals 101 and 103 can be a higher voltage terminal and a lower voltage terminal, respectively, e.g., an anode and a cathode of a supply voltage. The ESD protection circuit 104 is connected in parallel to the core circuit 102 and configured to protect the core circuit 102 during an ESD event by discharging a high voltage applied on the core circuit 102, e.g., between terminals 101 and 103.

The ESD protection circuit 104 includes a N-type transistor and a P-type transistor. The N-type transistor can be an NPN BJT or an NMOS transistor. The P-type transistor can be a PNP BJT or a PMOS transistor. In some implementations, the P-type transistor acts as a trigger source configured to trigger on the N-type transistor to conduct an ESD current during an ESD event. In some implementations, the N-type transistor acts as a trigger source configured to trigger on the P-type transistor to conduct an ESD current during an ESD event.

For illustration only, as shown in FIG. 1A, the ESD protection circuit 104 includes two bipolar junction transistors (BJTs) 106 and 108 arranged in parallel with each other between terminals 101 and 103. An emitter and a base of the BJT 106 are both electrically coupled to terminal 101, and a collector of the BJT 106 is electrically coupled to terminal 103. An emitter and a base of the BJT 108 are both electrically coupled to the connector of the BJT 106 and accordingly coupled to terminal 103, and a collector of the BJT 108 is electrically coupled to the base of the BJT 106 and accordingly coupled to terminal 101.

The BJT 106 can be a trigger source configured to be turned on by a trigger voltage applied between terminals 101 and 103 on the base of the BJT 106 to generate a trigger current to the base of the BJT 108, and the BJT 108 can be turned on by the trigger current to conduct a discharge current from higher voltage terminal 101 to lower voltage terminal 103 so that the core circuit 102 can be protected from damage. In some examples, the BJT 106 is a PNP BJT and the BJT 108 is an NPN BJT. In some examples, instead of using the PNP BJT, the trigger source can be a PMOS transistor that includes the emitter of the PNP BJT as a source side, the base of the PNP BJT as a body side, the conductor of the PNP BJT as a drain side, and a conductive layer as a gate side.

Figure 1B:
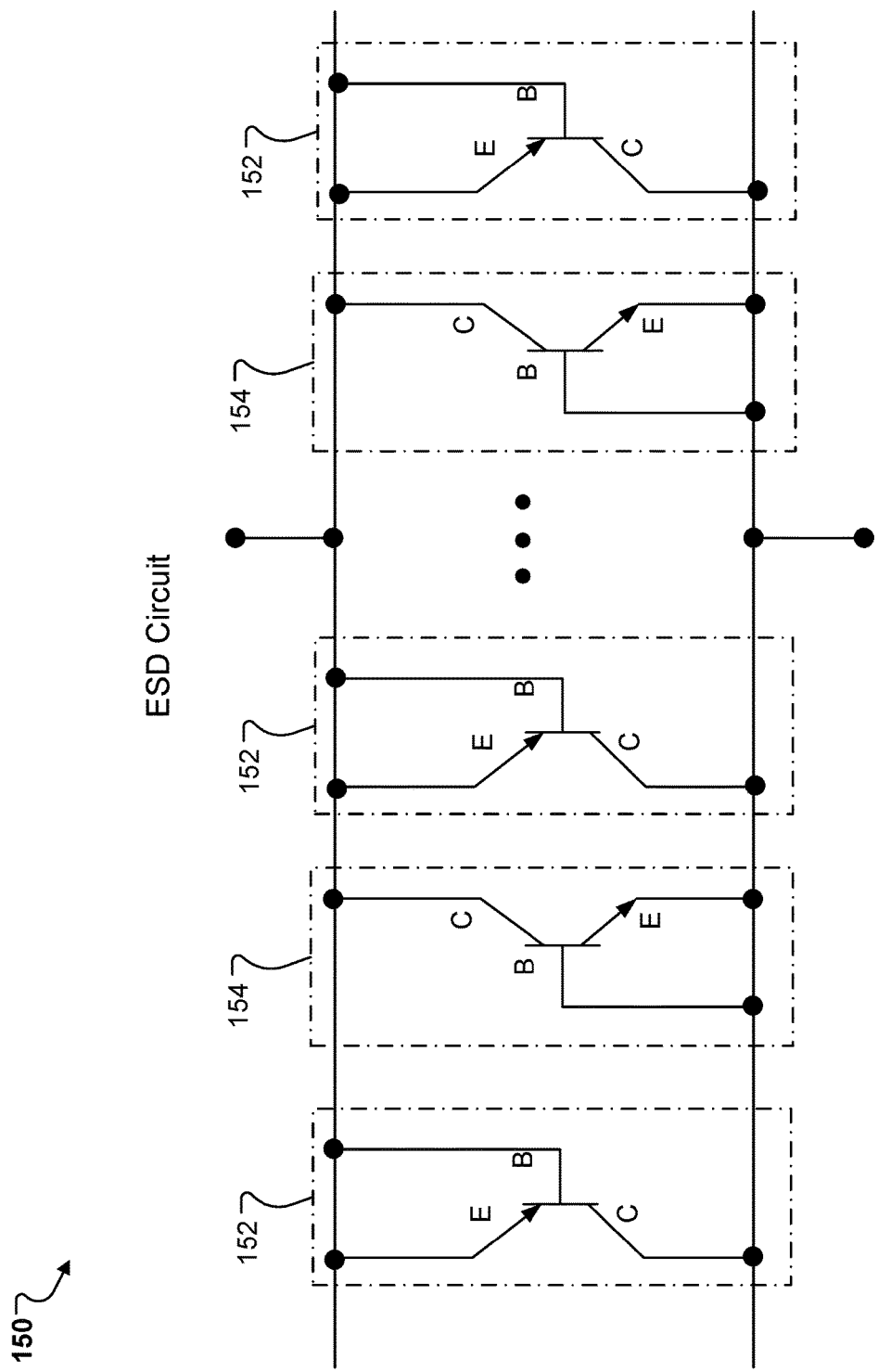
FIG. 1B is a schematic diagram of an example ESD protection circuit, according to one or more implementations.

FIG. 1B shows another example ESD protection circuit 150. The ESD protection circuit 150 can be similar to the ESD protection circuit 104 of FIG. 1A and connected between terminals 101 and 103. The ESD protection circuit 150 includes a number of PNP BJTs 152 and a number of NPN BJTs 154. Each PNP BJT 152 and each NPN BJT 154 are coupled between terminals 101 and 103 and parallel to each other. The PNP BJTs 152 can be equivalent to one PNP BJT, e.g., the BJT 106 of FIG. 1A, and the NPN BJTs 154 can be equivalent to one NPN BJT, e.g., the BJT 108 of FIG. 1A.

Each NPN BJT 154 is arranged between two adjacent PNP BJTs 152. In some cases, the two adjacent PNP BJTs 152 are turned on by a voltage applied between terminals 101 and 103 to generate respective trigger currents and the NPN BJT 154 is turned on by the respective trigger currents from the adjacent PNP BJTs 152. As discussed in further details below in FIGS. 2A-2C, the ESD protection circuit 150 can be fabricated by forming a number of N+ highly doped (or implanted) regions distributed in a P+ highly doped (or implanted) region.

Figure 2A:
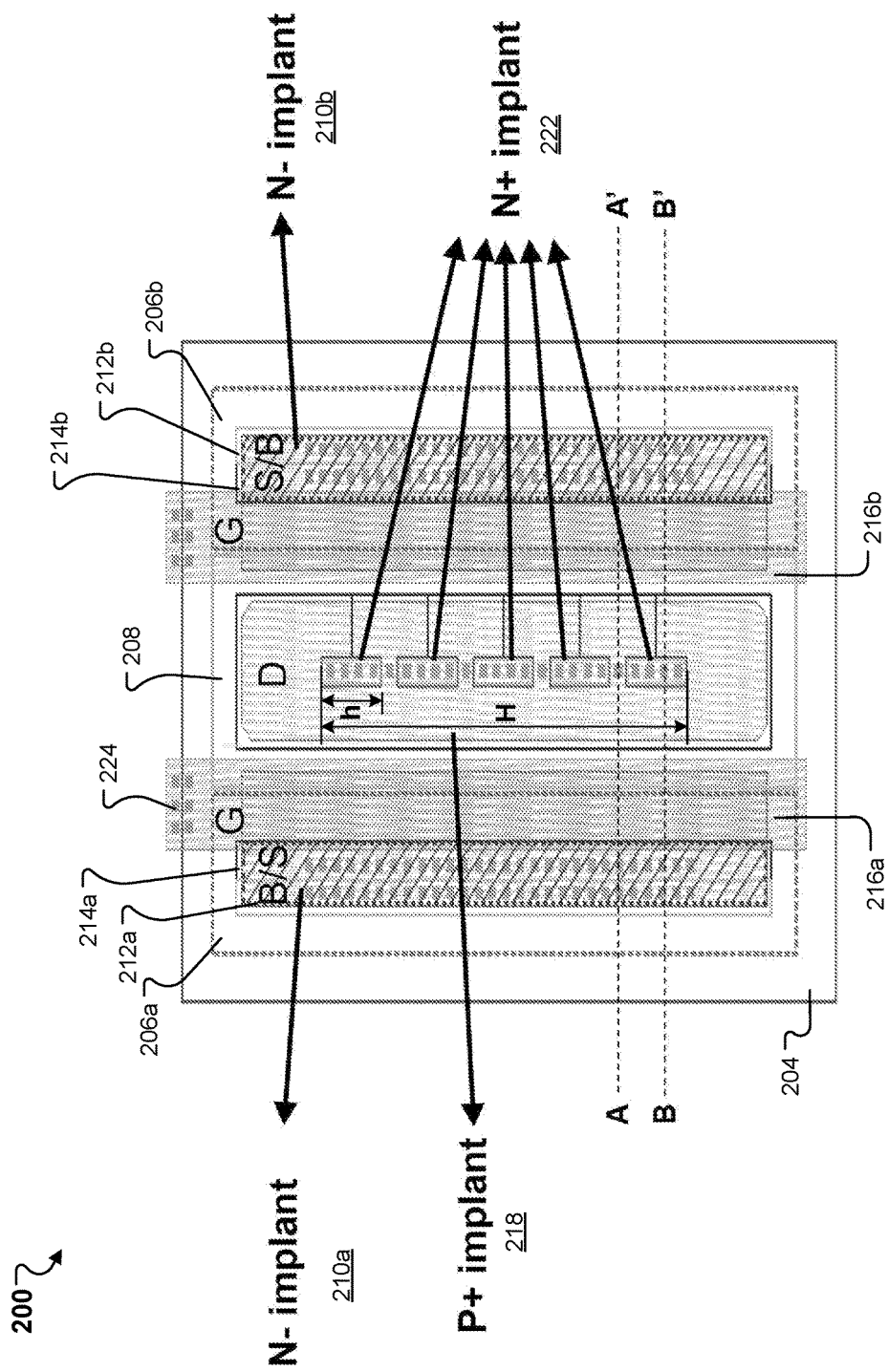
FIG. 2A is a schematic diagram illustrating a top view of an example ESD protection device, according to one or more implementations.
Figure 2B:
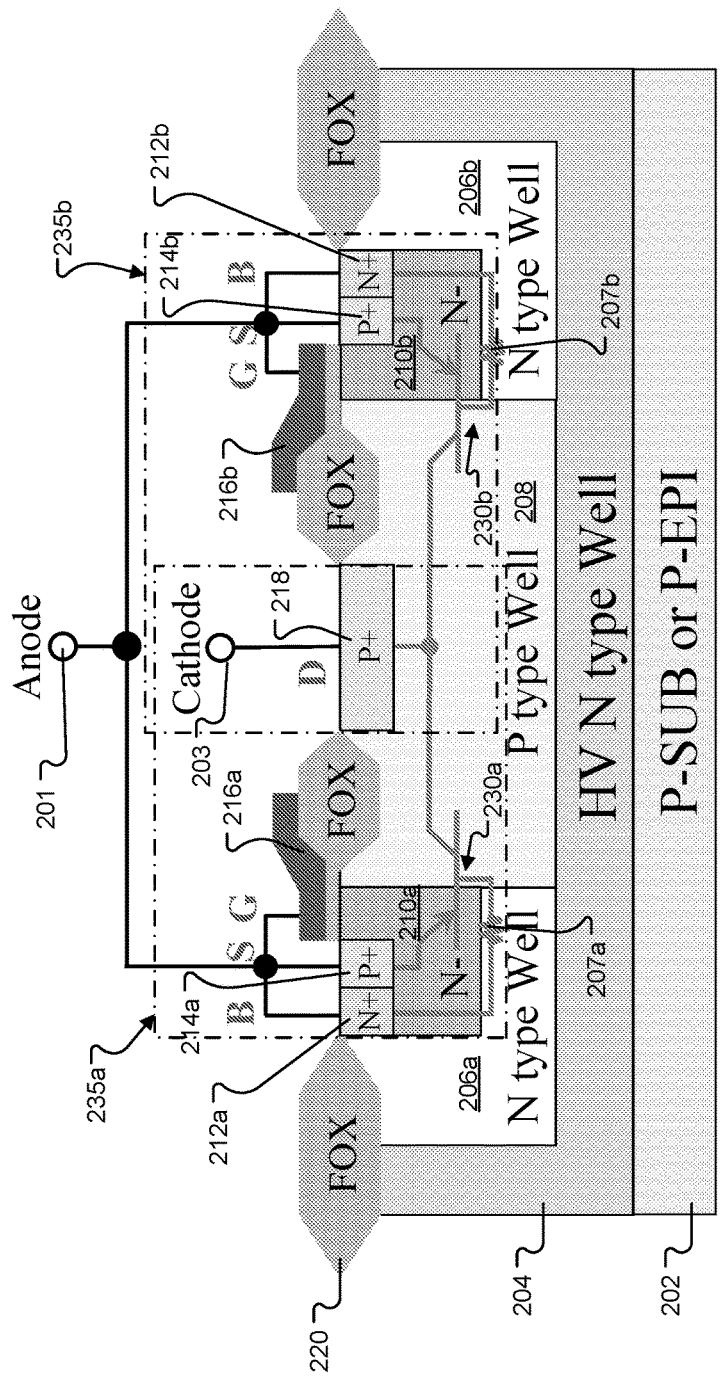
FIG. 2B is a schematic diagram illustrating a cross-sectional view taken along a cross-sectional line A-A' of FIG. 2A.
Figure 2C:
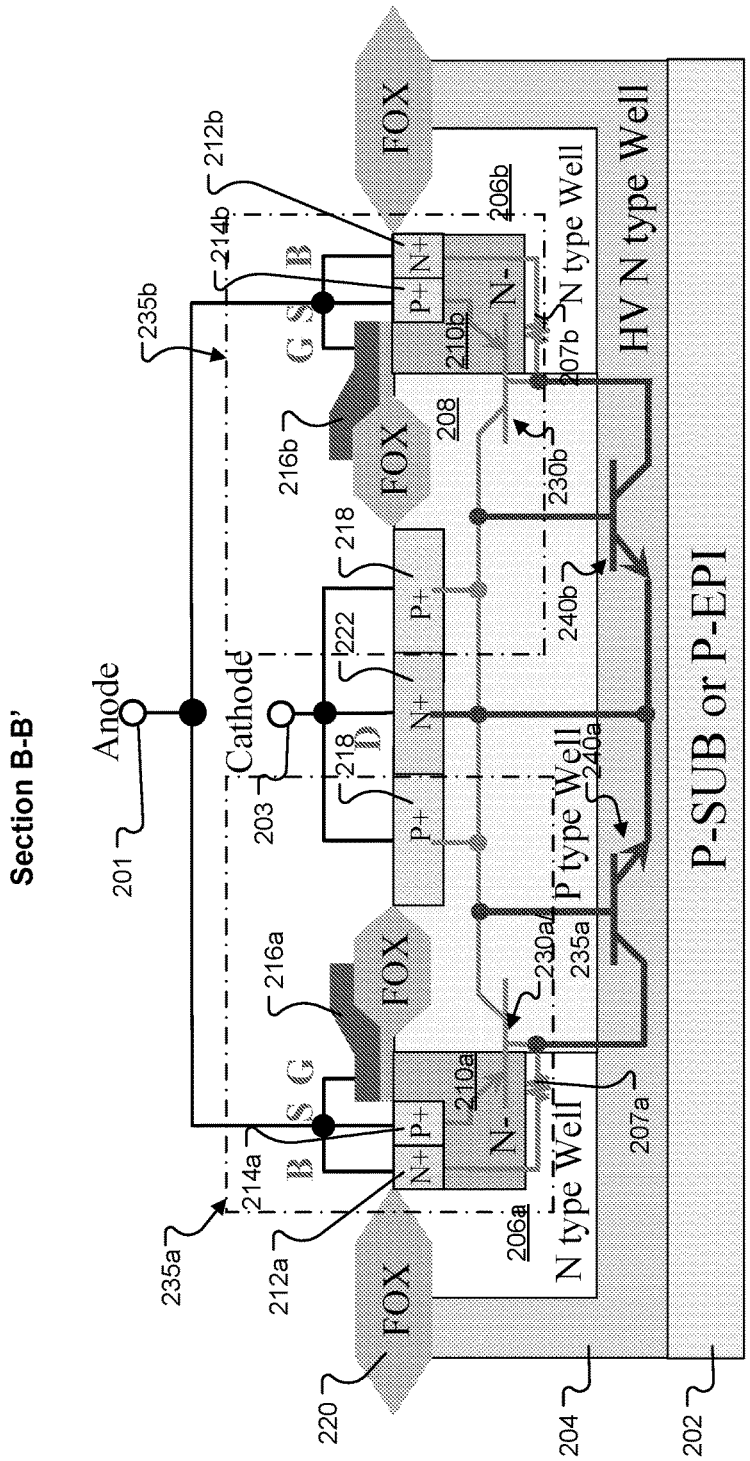
FIG. 2C is a schematic diagram illustrating a cross-sectional view taken along a cross-sectional line B-B' of FIG. 2A.

FIGS. 2A-2C show an example ESD protection device 200, where FIG. 2A is a schematic diagram illustrating a top view of the ESD protection device 200, FIG. 2B is a schematic diagram illustrating a cross-sectional view taken along a cross-sectional line A-A' of FIG. 2A, and FIG. 2C is a schematic diagram illustrating a cross-sectional view taken along a cross-sectional line B-B' of FIG. 2A. The ESD protection device 200 can include the ESD protection circuit 104 of FIG. 1A or 150 of FIG. 1B. The ESD protection device 200 can be single-poly device or double-poly device. For illustration only, the ESD protection device 200 has a double-poly structure.

Referring to FIG. 2B, the ESD protection device 200 includes a substrate 202 which can be a P-type material substrate or an epitaxially-grown P-layer (P-EPI) formed on a substrate. An N type base well 204 is formed (e.g., disposed) on top of the substrate 202. The N type base well 204 is configured for high voltage (HV) application and has a suitable concentration of N dopants, e.g., about $10^{12}$ cm$^{-3}$. The N type base well 204 can be an N+ buried layer or multiple N+ buried layers stacked on the substrate 202, an N-EPI layer, or a deep N type well.

N type wells 206a, 206b are formed in the N type base well 204. The N-type wells 206a, 206b are shallower than the N type base well 204. A P type well 208 is also formed in the N type base well 204. The P-type well 208 is also shallower than the N type base well 204. The P-type well 208 and the N-type wells 206a, 206b can have about the same depth. As illustrated in FIG. 2B, the P type well 208 can be adjacent to the N type wells 206a, 206b. The N type wells 206a, 206b can be surrounded by edges of the N type base well 204. That is, the P type well 208 is positioned between the N type wells 206a, 206b. The N type well 206a, 206b each can have a concentration of N dopants, e.g., about $10^{13}$ cm$^{-3}$, higher than the concentration of N dopants of the N type base well 204. The P type well 208 can have a concentration of P dopants, e.g., about $10^{12}$ cm$^{-3}$.

In some implementations, the N type wells 206a, 206b and the P type well 208 are formed in the N type base well 204, for example, by implanting N dopants and P dopants into different regions within the N type base well 204, respectively. In some implementations, the N type wells 206a, 206b and the P type well 208 are disposed on the top of N type base well 204, e.g., in a recess of the N type base well 204. The N type well 206a or 206b can include an N+ buried layer stacked on the N type base well 204. The P type well 208 can include a P+ buried layer stacked on the N type base well 204.

A highly doped N+ region 212a and a highly doped P+ region 214a can be formed in the N type well 206a, e.g., by implanting N dopants and P dopants, respectively. Similarly, a highly doped N+ region 212b and a highly doped P+ region 214b can be formed in the N type well 206b, e.g., by implanting N dopants and P dopants, respectively. Each highly doped N+ region 212a, 212b can have a concentration of N dopants, e.g., about $10^{14}$ to $10^{16}$ cm$^{-3}$, higher than the concentration of N dopants in the N type well 206a, 206b. Each highly doped P+ region 214a, 214b can have a concentration of P dopants, e.g., about $10^{14}$ to $10^{16}$ cm$^{-3}$, higher than the concentration of P dopants in the P type well 208. The highly doped N+ regions 212a, 212b are positioned farther from the P type well 208 than the highly doped P+ region 214a, 214b, respectively. The highly doped P+ regions 214a, 214b are spaced apart from the P type well 208.

In some implementations, lowly doped N− regions 210a, 210b are formed in the N type well 206a, 206b, e.g., by diluting the concentration of N dopants in the N type well or by forming additional N type wells with lower concentration of N dopants than the N type well 206a, 206b. As discussed in further details in FIG. 3 and FIG. 4B, the lowly doped N− region 210a, 210b can reduce a resistance of the ESD protection device 200 thus to increase a trigger current during an ESD event, e.g., to a value higher than 0.2 A, which can be easier to avoid latch-up. Each lowly doped N− region 210a, 210b can have a concentration of N dopants, e.g., about $10^{12}$ cm$^{-3}$, lower than the concentration of N dopants in the N type well 206a, 206b.

The highly doped N+ region 212a and the highly doped P+ region 214a can be formed in the lowly doped N− region 210a, and the highly doped N+ region 212b and the highly doped P+ region 214b can be formed in the lowly doped N− region 210b. The highly doped P+ regions 214a, 214b are separated from the P-type well 207 by a portion of the N-region 210a, 210b, respectively.

A highly doped P+ region 218 can be formed in the P type well 208. The highly doped P+ region 218 can have a concentration of P dopants, e.g., about $10^{14}$ to $10^{16}$ cm$^{-3}$, higher than the concentration of P dopants in the P type well 208. The highly doped P+ regions 214a, 214b in the N type wells 206a, 206b (e.g., in the lowly doped N− regions 210a, 210b) are separated (or isolated) from the highly doped P+ region 218 by field-oxide films (FOX) 220, which can be deposited on surfaces of the N type wells 206a, 206b and the P type well 208. The highly doped N+ regions 212a, 212b in the N type wells 206a, 206b (e.g., in the lowly doped N− regions 210a, 210b) can be separated (or isolated) from edges of the N type wells 206a, 206b or edges of the N type base well 204 by the FOX 220. In other words, the FOX 220 covers the top of the N type base well 204, the N type wells 206a, 206b, and the P type well 208, except the highly doped N+ regions 212a, 212b, the highly doped P+ regions 214a, 214b, and the highly doped P+ region 218. The FOX 220 can be formed by local oxidation of silicon (LOCOS), e.g., shallow trench isolation (STI).

The highly doped N+ region 212a and P+ region 214a in the N type well 206a can be electrically coupled to a higher voltage terminal, e.g., an anode 201 of the ESD protection device 200. Similarly, the highly doped N+ region 212b and P+ region 214b in the N type well 206b are electrically coupled to the higher voltage terminal, e.g., the anode 201. The highly doped P+ region 218 in the P type well 208 is electrically coupled to a lower voltage terminal, e.g., a cathode 203 of the ESD protection device 200.

The P+ region 214a, N+ region 212a, and P+ region 218 can constitute a P-type transistor. In some implementations, the P-type transitory is a PNP bipolar junction transistor (BJT) 230a with the P+ region 214a as an emitter, the N+ region 212a as a base, and the P+ region 218 as a collector. Similarly, the P+ region 214b, N+ region 212b, and P+ region 218 constitute another PNP bipolar junction transistor (BJT) 230b with the P+ region 214b as an emitter, the N+ region 212b as a base, and the P+ region 218 as a collector. In some cases, parasitic resistors 207a, 207b may be formed in the N type wells 206a, 206b, respectively.

In some implementations, a conductive layer 216a, e.g., a polysilicon layer, is deposited on top of the FOX 220 between the P+ region 214a in the N type well 206a and the P+ region 218 in the P type well 208. In this case, the P-type transistor can be a P type metal-oxide-semiconductor (MOS) transistor 235a that includes the P+ region 214a, the N+ region 212a, and the conductive layer 216a. In particular, the PMOS transistor 235a can include the P+ region 214a as a source side, the N+ region 212a as a body side, the conductive layer 216a as a gate side, and the P+ region 218 as a drain side. Similarly, a conductive layer 216b, e.g., a polysilicon layer, can be deposited on top of the FOX 220 between the P+ region 214b in the N type well 206b and the P+ region 218 in the P type well 208. The P+ region 214b, the N+ region 212b, the conductive layer 216b, and the P+ region 218 can constitute another P type metal-oxide-semiconductor (PMOS) transistor 235b with the P+ region 214b as a source side, the N+ region 212b as a body side, the conductive layer 216b as a gate side, and the P+ region 218 as a drain side.

Referring to FIG. 2A, individual electric contacts 224, e.g., metal layers, can be deposited on the source, body, gate and drain sides of the PMOS transistors 235a, 235b that are electrically coupled to the anode 201 and the cathode 203 via the electric contacts 224. As noted above, the N+ region 212a as the body side of the PMOS transistor 235a and the P+ region 214a as the source side of the PMOS transistors 235a are formed in the lowly doped N-region 210a; the N+ region 212b as the body side the PMOS transistor 235b and the P+ region 214b the PMOS transistor 235b as the source side are formed in the lowly doped N− region 210b; and the drain side of the PMOS transistors 235a, 235b corresponds to the highly doped P+ region 218 formed in the P type well 208.

In some implementations, as illustrated in FIG. 2A, one or more highly doped N+ regions 222 are formed in the highly doped P+ region 218 along a first direction perpendicular to edges of an area defined by the P+ region 218, e.g., along a channel length. The highly doped N+ regions 222 are distributed in the P+ region 218 along the first direction and separated by respective portions of the highly doped P+ region 218. Electric contacts 224 are also formed on top of each of the N+ regions 222 and each of the portions of the P+ region 218 that are electrically coupled to the cathode 203 via the electric contacts 224.

FIG. 2C shows a cross-sectional view taken along a cross-sectional line B-B' of FIG. 2A, which is in a second direction perpendicular to the first direction, e.g., along a channel width. In some implementations, along the second direction, a highly doped N+ region 222 is formed in the P+ region 218. In some implementations, along the second direction, two or more highly doped N+ regions can be formed in the P+ region 218.

As illustrated in FIG. 2C, an N+ region 222 is formed between two portions of the P+ region 218, which includes a first portion as the drain side of the PMOS 235a and a second portion as the drain side of the PMOS 235b. The N+ region 222 is electrically coupled to the first portion of the P+ region 218. An NPN BJT 240a can be constituted with the N+ region 222 as an emitter, the first portion of the P+ region 218 as a base, and the N+ region 212a in the N type well 206a as a collector. The collector of the NPN BJT 240a is electrically coupled to the base of the PNP BJT 230a, e.g., via the parasitic transistor 207a, or the body side of the PMOS transistor 235a. The base and the emitter of the NPN BJT 240a are electrically coupled to the collector of the PNP BJT 230a (or the drain side of the PMOS transistor 235a). Thus, the NPN BJT 240a is operably parallel to the PNP BJT 230a (or the PMOS transistor 235a) between the anode 201 and the cathode 203.

Similarly, the N+ region 222 is electrically coupled to the second portion of the P+ region 218. An NPN BJT 240b can be constituted with the N+ region 222 as an emitter, the second portion of the P+ region 218 as a base, and the N+ region 212b in the N type well 206b as a collector. The collector of the NPN BJT 240b is electrically coupled to the base of the PNP BJT 230b, e.g., via the parasitic transistor 207b, or the body side of the PMOS transistor 235b. The base and the emitter of the NPN BJT 240b are electrically coupled to the collector of the PNP BJT 230b or the drain side of the PMOS transistor 235b. Thus, the NPN BJT 240b is operably parallel to the PNP BJT 230b (or the PMOS transistor 235b) between the anode 201 and the cathode 203.

In operation, when an ESD event occurs, a voltage applied between the anode 201 and the cathode 203 may increase from a breakdown voltage to a trigger voltage, and the PNP BJT 230a can be turned on by the trigger voltage to generate a trigger current to the NPN BJT 240a, e.g., to a base of the NPN BJT 240a. The NPN BJT 240a can be triggered on (or turned on) by the trigger current and conduct an ESD current from the anode 201 to the cathode 203, thereby protecting a circuit or device, e.g., a core circuit 102 of FIG. 1A, from damage. Similarly, the PNP BJT 230b can be turned on by the trigger voltage to generate a trigger current to the NPN BJT 240b, which can be triggered on by the trigger current to conduct an ESD current from the anode 201 to the cathode 203.

Referring back to FIG. 2A, as noted above, one or more highly doped N+ regions 222 can be formed in the highly doped P+ region 218 along the first direction and separated by respective portions of the P+ region 218. Each of the respective portions of the P+ region 218 can constitute a respective PNP BJT with the N+ region 212a and P+ region 214a in the N type well 206a, as illustrated in FIG. 2B. Each of the N+ regions 222 can constitute a respective NPN BJT with the N+ region 212a in the N type well and a portion of the P+ region 218 in the P type well 208, as illustrated in FIG. 2C. Each of the respective PNP BJTs and each of the respective NPN BJTs can be operably parallel between the anode 201 and the cathode 203 of the ESD protection device 200, which is similar to the ESD protection circuit 150 of FIG. 1B.

In some examples, an NPN BJT is arranged between two adjacent PNP BJTs. During an ESD event, the adjacent PNP BJTs are operable to be turned on by the trigger voltage to generate respective trigger currents to a base of the NPN BJT, and the NPN BJT can be triggered on by the respective trigger currents to conduct an ESD current.

A height of an area defined by the P+ region 218 and covered by electric contact 224 along the first direction is H. A height of an area defined by a N+ region 222 along the first direction is h. The N+ regions 222 can have different heights or a same height. Suppose that there are m N+ regions each having a same height h, a height of the portions of P+ region along the first direction is H−m*h, then a ratio R between the total height of the N+ regions 222 and the total height of the portions of P+ region can be expressed as:

$$R = m*h/(H-m*h).$$

A trigger voltage of the ESD protection device 200 can be based on the number m of the N+ regions 222 and/or the ratio R. In a particular example, as discussed in FIG. 4B, when the number of the N+ regions 222 is 5 and the ratio is 1.6~1.9, the trigger voltage of the ESD protection device 200 can be reduced up to 50% compared to a PMOS transistor as an ESD protection device, e.g., the PMOS transistor 235a or 235b of FIG. 2B.

In some implementations, as noted above, one or more highly doped N+ regions can be also formed in the highly doped P+ region 218 along the second direction and separated by respective portions of the P+ region 218. The trigger voltage of the ESD protection device can be based on the N+ regions in the second direction. In some implementations, multiple highly doped N+ regions can be formed in an array of columns and rows in the highly doped P+ region 218 and supported by respective portions of the P+ region 218. The trigger voltage of the ESD protection device can be based on the array of N+ regions.

FIG. 3 is a schematic diagram of an example transmission-line pulse (TLP) curve 300 of an ESD protection device, according to one or more implementations. The ESD protection device can be the ESD protection circuit 104 of FIG. 1A or 150 of FIG. 1B, or the ESD protection device 200 of FIGS. 2A-2C. The ESD protection device can include a PNP BJT (or a PMOS transistor) and an NPN BJT in parallel between an anode and a cathode of the ESD protection device. The PNP BJT can be the PNP BJT 106 of FIG. 1A or 152 of FIG. 1B, or the PNP BJT 230a, 230b of FIGS. 2A-2C. The PMOS transistor can be the PMOS transistor 235a or 235b of FIGS. 2A-2C. The NPN BJT can be the NPN BJT 108 of FIG. 1A or 154 of FIG. 1B, or the NPN BJT 240a, 240b of FIGS. 2A-2C.

The TLP curve 300 can be obtained by performing a TLP test on the ESD protection device. For example, the TLP test can be based on charging a transmission line, e.g., a long, floating cable, to a pre-determined voltage and discharging it into the ESD protection device. The transmission line discharge emulates an electro-static discharge (ESD) event, employing time-domain reflectometry (TDR), which allows transient current and voltage waveform to be monitored as a function of time. The TLP curve 300 shows a relationship of a TLP test voltage (V) and a TLP test current (A) during a pulse test. As shown in FIG. 3, the TLP curve 300 can be divided into three phases A, B, C.

In phase A, when an ESD event occurs, a voltage applied on the ESD device exceeds a breakdown voltage of the ESD device and increases from the breakdown voltage to a trigger voltage, e.g., as indicted by a turning point 302 on the TLP curve 300. The PNP BJT is turned on by the trigger voltage to generate a corresponding trigger current, e.g., as indicated by the turning point 302.

The trigger current from the PNP BJT flows to the NPN BJT, e.g., to a base, and the NPN BJT is turned on by the trigger current to conduct a discharge current from the anode to the cathode. Accordingly, the TLP voltage is decreasing from the trigger voltage to a holding voltage, while the TLP current is increasing from a trigger current to a holding current. Another turning point 304 represents the holding voltage and the holding current. The snap-back behavior is shown by phase B.

Then the ESD device may maintain the TLP voltage at a level of the holding voltage, while the TLP current increases from the holding current to a higher ESD current (indicated by point 306), as shown in phase C. Thus, both the PNP BJT and NPN BJT are turned on to discharge the ESD current from the anode to the cathode.

FIG. 4A shows measurement data 400 of example breakdown voltage testing curves 410, 420 of ESD protection devices. The breakdown voltage testing can be performed by a DC voltage measurement. Curve 410 shows the breakdown voltage testing of a first ESD protection device including a PMOS transistor (e.g., the PMOS transistor 235a of FIG. 2B), while curve 420 shows the breakdown voltage testing of a second ESD protection device (e.g., the ESD protection device 200 of FIGS. 2A-2C) including a PMOS transistor and an NPN BJT that are operably parallel between an anode and a cathode.

Both curves 410 and curve 420 show the first and second ESD protection devices have the same breakdown voltage. That is, adding a parallel NPN BJT to the PMOS transistor to form the second ESD protection device does not increase the breakdown voltage of the first ESD protection device.

FIG. 4B shows measure data 450 of example TLP testing curves 460 and 470 of the first and second ESD protection devices of FIG. 4A, respectively. Particularly, the second ESD protection device includes multiple distributed N+ regions formed in a highly doped P+ region, as illustrated in FIG. 2A. The number of N+ regions can be 5, and the ratio between a length of N+ regions and a length of portions of the P+ region along the first direction is about 1.6~1.9.

The TLP testing curve 460 shows that the first ESD protection device has a trigger voltage of about 58 V (as indicated by point 462) and an ESD current of about 1.3 amperes (as indicated by point 464). The TLP testing curve 470 shows that the second ESD protection device has a trigger voltage of about 29 V (as indicated by point 472), a holding voltage (as indicated by point 474), and an ESD current of about 8.5 amperes (as indicated by point 476). Thus, compared to the first ESD protection device, the trigger voltage of the second ESD protection device is decreased by 50%. Without being limited to any particular theory, this reduction in trigger voltage might be contributed mainly by the multiple highly doped N+ regions formed in the highly doped P+ region in a drain side of the PMOS transistor; the ESD current of the ESD protection device is increased by 6.5 times, which may be contributed by a lowly doped N− region formed in an N-type well to decrease a resistance of the ESD protection device. The performance of the second ESD protection device may be further improved by optimizing the number of N+ regions in the P+ region, the length ratio, and/or a concentration of N dopants in the lowly doped N− region.

Figure 5:
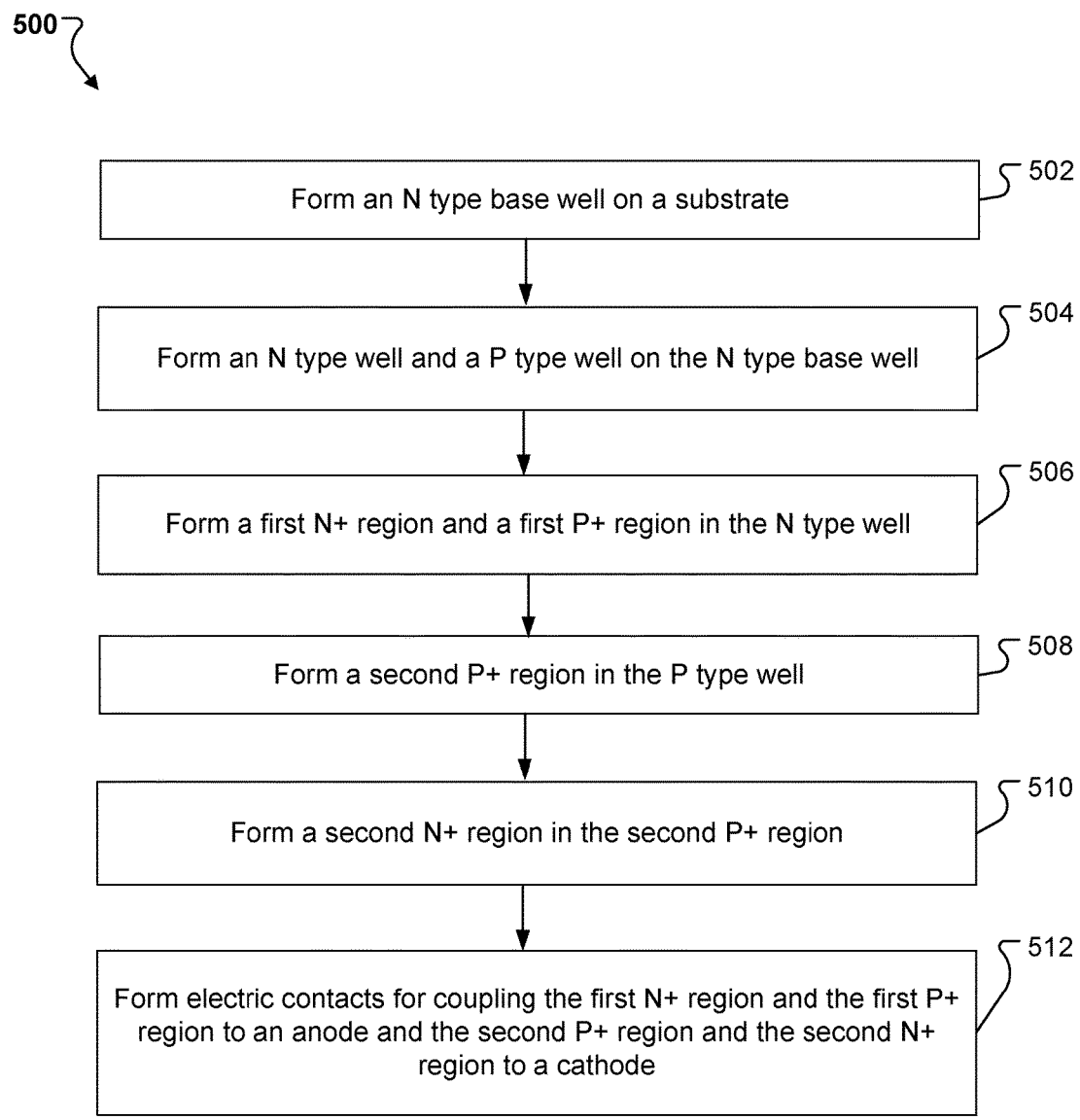
FIG. 5 shows an example process to fabricate an ESD protection device, according to one or more implementations.

FIG. 5 shows an example process 500 to fabricate an ESD protection device, according to one or more implementations. The ESD protection device can be fabricated by standard processes, e.g., triple well process and/or BCD process. The ESD protection device can be the ESD protection circuit 104 of FIG. 1A or 150 of FIG. 1B, or the ESD protection device 200 of FIGS. 2A-2C. For illustration only, the ESD protection device can include a P-type transistor (e.g., a PNP BJT or a PMOS transistor) and an NPN BJT in parallel between an anode and a cathode of the ESD protection device.

An N type base well of a first dopant type (N type) is formed on a substrate (502). The substrate can be a P type substrate or a substrate with a disposed P-EPI layer. The N type base well can be an N+ buried layer or multiple N+ buried layers stacked on the substrate, an N-EPI layer, or a deep N type well.

An N type well and a P type well are formed in the N type base well (504). The P type well can be adjacent to the N type well that can be surrounded by an edge of the N type base well. The N type well can have a concentration of N dopants, e.g., about $10^{13}$ cm$^{-3}$, higher than a concentration of N dopants of the N type base well, e.g., about $10^{12}$ cm$^{-3}$. The P type well can have a concentration of P dopants, e.g., about $10^{12}$ cm$^{-3}$.

In some implementations, the N type well and the P type well are formed in the N type base well, for example, by implanting N dopants and P dopants into different regions within the N type base well, respectively. In some implementations, the N type well and the P type well are disposed on the top of N type base well, e.g., in a recess of the N type base well. The N type well can include an N+ buried layer stacked on the N type base well. The P type well can include a P+ buried layer stacked on the N type base well.

A first highly doped N+ region and a first highly doped P+ region are formed in the N type well (506). In some implementations, the first N+ region and the first P+ region are formed by implanting N dopants and P dopants into respective regions in the N type well. The first N+ region can have a concentration of N dopants, e.g., about $10^{14}$ to $10^{16}$ cm$^{-3}$, higher than the concentration of N dopants in the N type well, e.g., about $10^{13}$ cm$^{-3}$. The highly doped P+ region can have a concentration of P dopants, e.g., about $10^{14}$ to $10^{16}$ cm$^{-3}$, higher than the concentration of P dopants in the P type well, e.g., about $10^{12}$ cm$^{-3}$. The first N+ region can be arranged further to the P type well than the first P+ region, and the first P+ region can be arranged with a distance from the P type well.

In some implementations, a lowly doped N− region is formed in the N type well, e.g., by diluting N dopants in the N type well or by forming an additional N type well with a lower concentration of N dopants than the N type well. The lowly doped N− region can have a concentration of N dopants, e.g., about $10^{12}$ cm$^{-3}$, lower than the concentration of N dopants in the N type well. Then the first highly doped N+ region and the first highly doped P+ region can be formed in the lowly doped N− region, e.g., by implanting N dopants to the respective regions or by forming an additional N type well or P type well in the respective regions.

A second highly doped P+ region is formed in the P type well (508), e.g., by implanting P dopants into the P type well. The second highly doped P+ region can have a concentration of P dopants, e.g., about $10^{14}$ to $10^{16}$ cm$^{-3}$, higher than the concentration of P dopants in the P type well 208, e.g., about $10^{12}$ cm$^{-3}$.

A second highly doped N+ region is formed in the second highly doped P+ region (510), e.g., by implanting N dopants into the P type well or forming an addition N buried layer in the P type well. During step 508, a mask can be used to cover an area for the second N+ region. During step 510, additional mask can be used to cover the formed second P+ region.

In some implementations, the first highly doped N+ region and the first highly doped P+ region in the N type well (e.g., in the lowly doped N− region) are separated (or isolated) from the second highly doped P+ region by field-oxide films (FOX), which can be deposited on surfaces of the N type well and the P type well. The highly doped first N+ region in the N type well can be separated (or isolated) from edges of the N type well or edges of the N type base well by the FOX. The FOX can be formed by local oxidation of silicon (LOCOS), e.g., shallow trench isolation (STI).

In some implementations, a conductive layer, e.g., a polysilicon layer, is formed (e.g., deposited) on top of the FOX between the first P+ region in the N type well and the second P+ region in the P type well. The conductive layer can be used as a gate side of a MOS transistor.

Electrical contacts are formed to electrically couple the first N+ region and the first P+ region in the N type well to a higher voltage terminal (e.g., an anode of the ESD protection device) and the second N+ region and the second P+ region in the P type well to a lower voltage terminal (e.g., a cathode of the ESD protection device) (512). In some implementations, the P-type transistor of the ESD protection device is a PNP BJT that includes the first N+ region as a base, the first P+ region as an emitter, and the second P+ region as a conductor. In some implementations, the P-type transistor is a PMOS transistor that includes the first N+ region as a body side, the first P+ region as a source side, the second P+ region as a drain side, and a conductive layer as a drain side. The first N+ region, the second P+ region, and the second N+ region can constitute an NPN BJT. The P-type transistor (the PNP BJT or the PMOS transistor) and the NPN BJT are operably parallel between the anode and the cathode.

In some implementations, a number of second highly doped N+ regions are formed in the second highly doped P+ region in the P type well, e.g., along a direction perpendicular to edges of an area defined by the second P+ region. Each of the second N+ regions is separated from each other by a respective portion of the second P+ region. Each of the respective portions of the second P+ region can constitute a respective PNP BJT (or PMOS transistor) with the first N+ region and the first P+ region in the N type well. Each of the second N+ regions can constitute a respective NPN BJT with the first N+ region and the second P+ region. Each of the PNP BJTs (or PMOS transistors) and each of the NPN BJTs are operably parallel between the anode and the cathode.

A number of implementations have been described. Nevertheless, it will be understood that various modifications may be made without departing from the spirit and scope of the techniques and devices described herein. Features shown in each of the implementations may be used independently or in combination with one another. Additional features and variations may be included in the implementations as well. Accordingly, other implementations are within the scope of the following claims.

What is claimed is:

1. An electrostatic discharge (ESD) protection device comprising:
   a base well of a first dopant type disposed on a substrate;
   a first well of the first dopant type disposed in the base well;
   a second well of a second dopant type disposed in the base well;
   a first highly doped region of the first dopant type and a second highly doped region of the second dopant type disposed in the first well;
   a third highly doped region of the second dopant type disposed in the second well;
   a fourth highly doped region of the first dopant type disposed in the third highly doped region, wherein the first highly doped region and the second highly doped region are coupled to a first voltage terminal, and the third highly doped region and the fourth highly doped region are coupled to a second, different voltage terminal; and
   a conductive layer coupled to the first voltage terminal,
   wherein the first highly doped region, the second highly doped region, the third highly doped region, and the conductive layer constitute a metal-oxide-semiconductor (MOS) transistor with the conductive layer as a gate.

2. The ESD protection device of claim 1, wherein the first highly doped region, the second highly doped region, and the third highly doped region constitute a first transistor, and the first highly doped region, the third highly doped region, and the fourth highly doped region constitute a second transistor, and
   wherein the first transistor and the second transistor are operably parallel between the first voltage terminal and the second voltage terminal.

3. The ESD protection device of claim 1, comprising a plurality of fourth highly doped regions of the first dopant type disposed and distributed in the third highly doped region,
   wherein each of the fourth highly doped regions is separated from each other by a respective portion of the third highly doped region.

4. The ESD protection device of claim 3, wherein each of the respective portions of the third highly doped region constitutes a respective first transistor with the first highly doped region and the second highly doped region,
   wherein each of the fourth highly doped regions constitutes a respective second transistor with the first highly doped region and the third highly doped region, and
   wherein each of the first transistors and the second transistors are operably parallel between the first voltage terminal and the second voltage terminal.

5. The ESD protection device of claim 3, wherein, along a direction perpendicular to an edge of an area defined by the third highly doped region, the first dopant type occupies a region having a first length, and the second dopant type occupies a region having a second length, and wherein a ratio of the first length over the second length is larger than 1.

6. The ESD protection device of claim 1, further comprising a lowly doped region of the first dopant type disposed in the first well, the first highly doped region and the second highly doped region being in the lowly doped region,
   wherein the lowly doped region has a lower concentration of the first dopant type than the first well, and the first highly doped region has a higher concentration of the first dopant type than the first well.

7. The ESD protection device of claim 1, wherein the first dopant type is N-type, and the second dopant type is P-type.

8. The ESD protection device of claim 1, wherein the substrate comprises a substrate of the second dopant type or an epitaxial layer of the second dopant type.

9. The ESD protection device of claim 1, further comprising:
   a third well of the first dopant type disposed in the base well adjacent to the second well; and
   a fifth highly doped region of the first dopant type and a sixth highly doped region of the second dopant type disposed in the third well,
   wherein the fifth highly doped region, the sixth highly doped region, and the third highly doped region constitute a third transistor, and the fifth highly doped region, the third highly doped region, and the fourth highly doped region constitute a fourth transistor, and
   wherein the fifth highly doped region and the sixth highly doped region are coupled to the first voltage terminal, the third transistor and the fourth transistor being operably parallel between the first voltage terminal and the second voltage terminal.

10. The ESD protection device of claim 1, further comprising a field oxide layer configured to isolate the third highly doped region from second highly doped region.

11. An electrostatic discharge (ESD) protection device comprising:
    a base well of a first dopant type disposed on a substrate;
    a first well of the first dopant type disposed in the base well;
    a second well of a second dopant type disposed in the base well;
    a first highly doped region of the first dopant type and a second highly doped region of the second dopant type disposed in the first well;
    a third highly doped region of the second dopant type disposed in the second well; and
    a fourth highly doped region of the first dopant type disposed in the third highly doped region,
    wherein the first highly doped region and the second highly doped region are coupled to a first voltage terminal, and the third highly doped region and the fourth highly doped region are coupled to a second, different voltage terminal,
    wherein the first highly doped region, the second highly doped region, and the third highly doped region constitute a first transistor, and the first highly doped region, the third highly doped region, and the fourth highly doped region constitute a second transistor, and
    wherein the first transistor and the second transistor are operably parallel between the first voltage terminal and the second voltage terminal.

12. The ESD protection device of claim 11, further comprising a lowly doped region of the first dopant type disposed in the first well, the first highly doped region and the second highly doped region being in the lowly doped region,
    wherein the lowly doped region has a lower concentration of the first dopant type than the first well, and the first highly doped region has a higher concentration of the first dopant type than the first well.

13. The ESD protection device of claim 11, wherein the first dopant type is N-type, and the second dopant type is P-type.

14. The ESD protection device of claim 11, wherein the substrate comprises a substrate of the second dopant type or an epitaxial layer of the second dopant type.

15. The ESD protection device of claim 11, further comprising:
- a third well of the first dopant type disposed in the base well adjacent to the second well; and
- a fifth highly doped region of the first dopant type and a sixth highly doped region of the second dopant type disposed in the third well,
- wherein the fifth highly doped region, the sixth highly doped region, and the third highly doped region constitute a third transistor, and the fifth highly doped region, the third highly doped region, and the fourth highly doped region constitute a fourth transistor, and
- wherein the fifth highly doped region and the sixth highly doped region are coupled to the first voltage terminal, the third transistor and the fourth transistor being operably parallel between the first voltage terminal and the second voltage terminal.

16. The ESD protection device of claim 11, further comprising a field oxide layer configured to isolate the third highly doped region from second highly doped region.

17. An electrostatic discharge (ESD) protection device comprising:
- a base well of a first dopant type disposed on a substrate;
- a first well of the first dopant type disposed in the base well;
- a second well of a second dopant type disposed in the base well;
- a first highly doped region of the first dopant type and a second highly doped region of the second dopant type disposed in the first well;
- a third highly doped region of the second dopant type disposed in the second well;
- a fourth highly doped region of the first dopant type disposed in the third highly doped region, wherein the first highly doped region and the second highly doped region are coupled to a first voltage terminal, and the third highly doped region and the fourth highly doped region are coupled to a second, different voltage terminal; and
- a plurality of fourth highly doped regions of the first dopant type disposed and distributed in the third highly doped region,
- wherein each of the fourth highly doped regions is separated from each other by a respective portion of the third highly doped region.

18. The ESD protection device of claim 17, wherein each of the respective portions of the third highly doped region constitutes a respective first transistor with the first highly doped region and the second highly doped region,
- wherein each of the fourth highly doped regions constitutes a respective second transistor with the first highly doped region and the third highly doped region, and
- wherein each of the first transistors and the second transistors are operably parallel between the first voltage terminal and the second voltage terminal.

19. The ESD protection device of claim 17, wherein, along a direction perpendicular to an edge of an area defined by the third highly doped region, the first dopant type occupies a region having a first length, and the second dopant type occupies a region having a second length, and wherein a ratio of the first length over the second length is larger than 1.

* * * * *